United States Patent [19]

Pumo

[11] 4,379,241
[45] Apr. 5, 1983

[54] EDGE DEFINED OUTPUT BUFFER CIRCUIT

[75] Inventor: Joseph Pumo, Austin, Tex.

[73] Assignee: Motorola, Inc., Schaumburg, Ill.

[21] Appl. No.: 149,607

[22] Filed: May 14, 1980

[51] Int. Cl.³ .................. H03K 17/693; H03K 19/096
[52] U.S. Cl. ...................................... 307/481; 307/269;
307/473; 307/583
[58] Field of Search ............... 307/239, 269, 279, 352,
307/353, 473, 480, 481, 525, 527, 528, 518, 582,
307/583, 304

[56] References Cited

U.S. PATENT DOCUMENTS

| | | | |
|---|---|---|---|
| 3,935,475 | 1/1976 | Margolies | 307/481 OR |
| 3,942,037 | 3/1976 | Mensch, Jr. | 307/518 OR |
| 4,224,533 | 9/1980 | Lai | 307/279 X |
| 4,287,442 | 9/1981 | Spinks et al. | 307/279 X |
| 4,317,053 | 2/1982 | Shaw et al. | 307/452 X |

*Primary Examiner*—Stanley D. Miller
*Assistant Examiner*—D. Hudspeth

*Attorney, Agent, or Firm*—Anthony J. Sarli; Vincent B. Ingrassia; Jeffrey Van Myers

[57] ABSTRACT

A three-state MOS circuit for buffering an input signal includes an edge definition circuit which is controlled by first and second independent clock signals. The edge definition circuit includes a first transistor for producing a low-to-high voltage transition when the input signal goes from a high to a low, and a second transistor for producing a high-to-low voltage transition in response to the input signal going from a low to a high. The generation of these high-to-low and low-to-high transitions are controlled by first and second independent clock signals. The output of the edge definition circuit is applied to a driver circuit which generates output control signals. The output control signals are applied to first and second output field effect transistors so as to generate a signal representative of the input signal. The circuit is also provided with means for receiving a three-state control signal, which means is controlled by a third clock signal for disabling the driver portion of the buffer circuit so as to render the circuit output floating.

11 Claims, 16 Drawing Figures

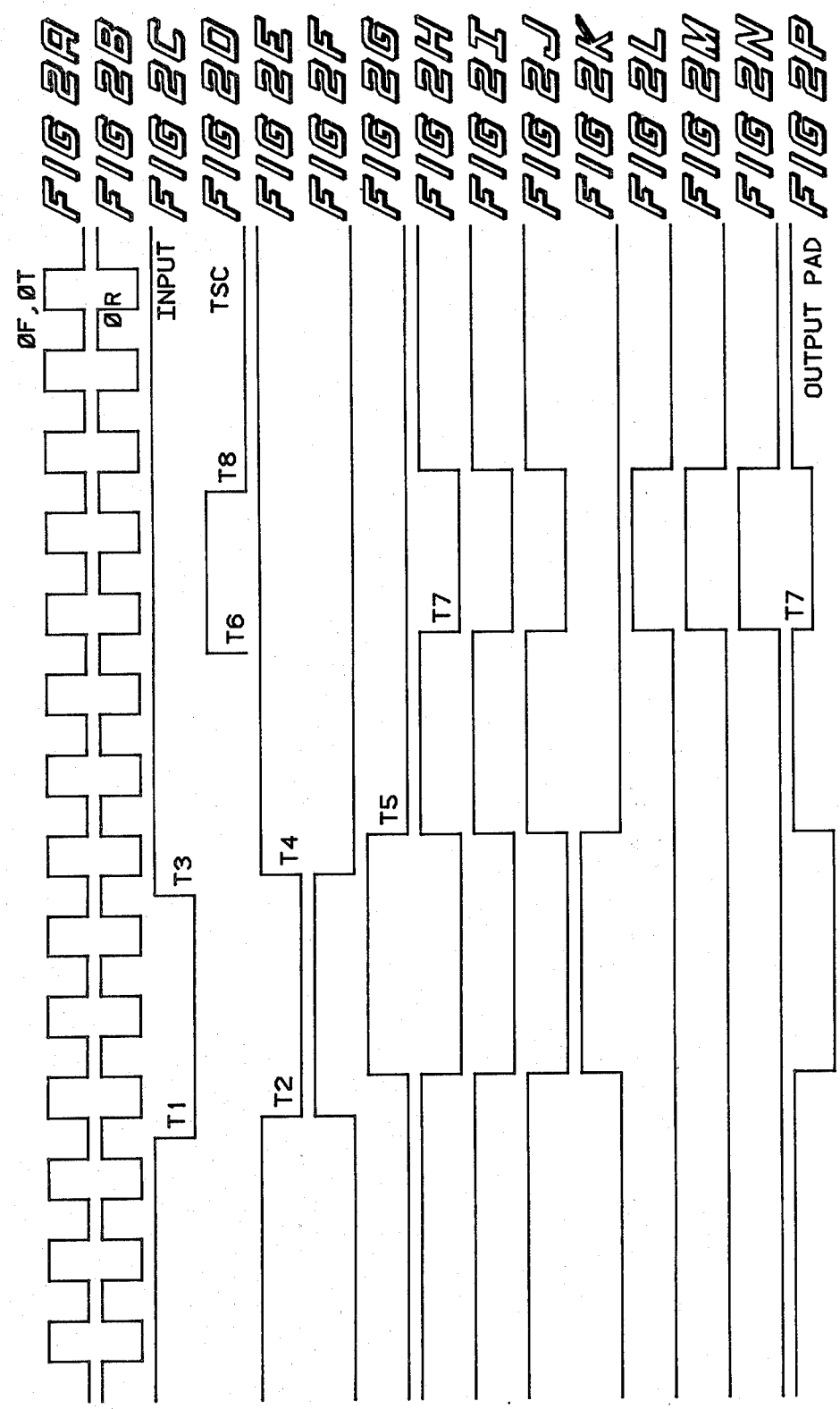

EDGE DEFINED OUTPUT BUFFER CIRCUIT

BACKGROUND OF THE INVENTION

1. Field of the Invention

This invention relates generally to synchronization circuits and, more particularly, to an MOS three-state output buffer synchronized with more than a single clock signal.

2. Description of the Prior Art

The advantages offered by NMOS technology are well known; e.g. higher density, greater yield, etc. The smaller NMOS device geometries permit a greater number of devices to be produced per unit area or, stated another way, a single device will occupy less space. This characteristic is extremely important in the design and fabrication of complex digital integrated circuits; for example, single chip microprocessors. However, if progress is to continue, further improvements in density, yield, speed and power consumption must be achieved.

In complex digital circuitry, it is often necessary to receive an input signal which is not necessarily synchronized with the clock signal which controls the digital circuitry. Such circuits are well known. However, in order to improve speed and flexibility of the overall system, it would be desirable to synchronize the incoming signal with more than a single rigid clock signal. Further, to enhance flexibility, it would be desirable to provide a synchronization circuit, which is capable of operating in a three-state mode such that upon receipt of an appropriate command, the output is left floating and available for use by other circuitry. Flexibility can be further enhanced by providing an output buffer which may be made conditional; that is, permit the buffer to discharge only when an external data signal commands it.

SUMMARY OF THE INVENTION

It is an object of the present invention to provide an improved output buffer circuit.

It is a further object of the invention to provide an improved edge definition circuit employing natural field effect transistors.

It is a still further object of the present invention to provide an improved MOS three-state output buffer circuit.

It is a still further object of the present invention to provide an MOS output buffer circuit which is capable of operation at higher speeds while at the same time consuming less power.

Yet another object of the invention is to provide an MOS output buffer circuit which synchronizes an input signal to more than a single rigid clock signal.

Finally it is an object of the present invention to provide a three-state output buffer circuit wherein the output is enabled only upon application of a specified control input.

According to an aspect of the invention there is provided an edge definition circuit for synchronizing an input signal with first and second clock signals, comprising: first means coupled to said input signal and to said first clock signal for producing a first voltage transition in response to a voltage transition of said input signal, said first voltage transition occurring at a time determined by said first clock signal; and second means coupled to said first means and said second clock signal for producing a second voltage transition in response to another transition of said input signal, said second voltage transition occurring at a time determined by said second clock signal.

According to a further aspect of the invention there is provided a circuit for buffering an input signal in accordance with occurrences of first and second clock signals, comprising: first means coupled to said input signal and to said first clock signal for producing a first voltage transition in response to a voltage transition of said input signal, said first voltage transition occurring at a time determined by said first clock signal; second means coupled to said first means and said second clock signal for producing a second voltage transition in response to another transition of said input signal, said second voltage transition occurring at a time determined by said second clock signal; driver circuit means coupled to said first and second means and responsive to said first and second voltage transitions for generating output control signals; and output means coupled to said driver circuit means for receiving said output control signals and generating therefrom an output signal representative of said input signal.

The above and other objects, features and advantages of the present invention will be more clearly understood from the following detailed description taken in conjunction with the accompanying drawings, in which:

BRIEF DESCRIPTION OF THE DRAWINGS

FIGS. 2A-2P illustrate waveforms appearing at various points in the circuit shown in FIG. 1.

DESCRIPTION OF THE PREFERRED EMBODIMENT

Figure 1:
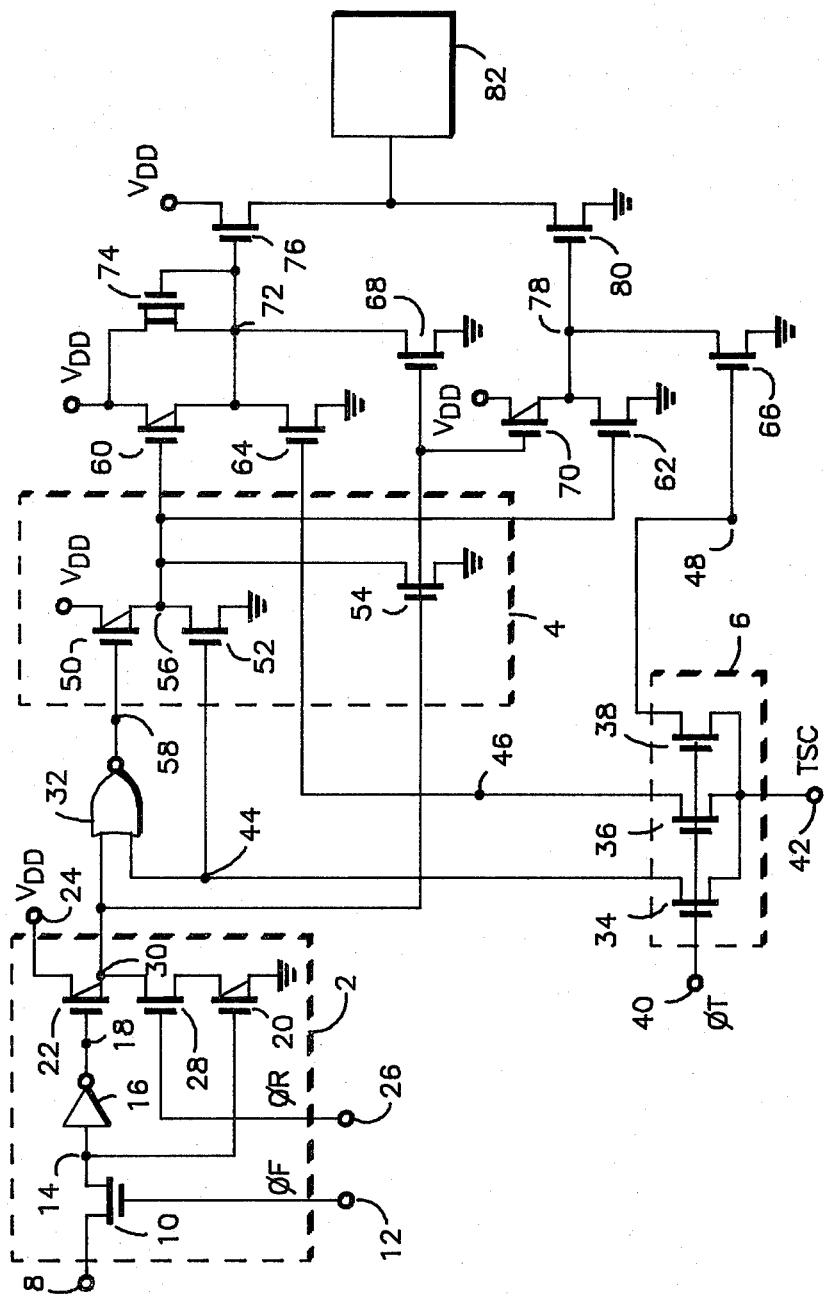
FIG. 1 is a schematic diagram of the inventive edge defined three-state output buffer circuit.

Before embarking on a discussion of the circuit shown in FIG. 1, it may be helpful to first establish definitions of the various devices mentioned in connection with the description of FIG. 1. First, a three-state circuit is a circuit capable of assuming three stable states. These are a high state (typically 2.4-3 volts), a low state (typically 0-0.4 volts) and a high impedance or floating state. A field effect transistor of the enhancement type is a device which is normally "off" and which is rendered conductive when a positive threshhold voltage is applied to its gate electrode. A field effect transistor of a depletion type is a device which is normally "on" with a negative threshhold voltage applied to its gate electrode. Finally, a natural field effect transistor is a non-ion-implanted device. Before substrate bias is applied, the device will have a slightly negative threshold voltage. When substrate bias is applied, the depletion region between the channel and bulk will get larger. Thus, a slight gate voltage may be required to turn the device on. It is not normally on as is the case with a depletion device. Ideally, the device has a zero volt threshold voltage; however, practically the threshold voltage may be slightly negative or slightly positive.

Referring now to FIG. 1, the inventive buffer circuit includes an edge definition portion 2, a pre-driver portion 4 and a three-state control portion 6.

Referring to the edge definition portion 2, an input terminal 8 receives an input signal (for example that shown in FIG. 2C). This input signal is coupled to an electrode of enhancement device 10, the gate electrode of which is coupled to a first clock signal input 12 (ØF shown in FIG. 2A). The second electrode of device 10 is coupled to the input of inverter 16 and to the gate of natural field effect transistor 20 having a source coupled to ground. The output of inverter 16 (node 18) is coupled to the gate of another natural field effect transistor 22 having a drain coupled to a source of supply voltage ($V_{DD}$) at terminal 24. A second clock signal ($\phi R$) is received at terminal 26 and is coupled to the gate of enhancement device 28 having a source coupled to the drain of device 20 and having a drain coupled to the source of natural device 22 (node 30). Node 30 is then coupled to a first input of NOR gate 32. Clock signal $\phi R$ is shown in FIG. 2B as being 180 degrees out of phase with clock signal $\phi F$ (FIG. 2A).

Three-state control section 6 is comprised of first, second and third enhancement field effect transistors 34, 36 and 38. A third clock signal ($\phi T$) is received at terminal 40 and is coupled to the gates of devices 34, 36 and 38. Each of devices 34, 36 and 38 have sources coupled to a three-state control signal (TSC) which is received at terminal 42. The drains of devices 34, 36 and 38 are coupled respectively to nodes 44, 46 and 48. While the clock signal received at terminal 40 ($\phi T$) is shown in FIG. 2A as being the equivalent of clock signal $\phi F$, it will be apparent that such equivalance is not a necessary requirement.

The pre-driver portion 4 is shown as being comprised of a natural transistor 50 and first and second enhancement devices 52 and 54 respectively. Device 50 has a drain coupled to $V_{DD}$, a gate coupled to the output of NOR gate 32 (node 58) and a source coupled to node 56. Enhancement device 52 has a source coupled to ground, a gate coupled to node 44 and a drain coupled to node 56. Enhancement 54 has a source coupled to ground, a gate coupled to node 30 and a drain coupled to node 56.

Node 56 in pre-driver 4 is also coupled to the gate electrodes of natural transistor 60 and enhancement transistor 62. Node 46 is coupled to the gate of enhancement transistor 64, node 48 is coupled to the gate of enhancement transistor 66, and node 30 in edge definition portion 2 is coupled to the gate of enhancement transistor 68 and to the gate of natural transistor 70. The drain electrodes of devices 60 and 70 are coupled to $V_{DD}$, and the source electrodes of devices 62, 64, 66 and 68 are coupled to ground. The junction connection of devices 60 and 64 (node 72) is coupled to the source and gate electrodes of depletion device 74, to the drain electrode of device 68 and to the gate electrode of pull-up transistor 76. The drain electrode of depletion device 74 is coupled to $V_{DD}$. The junction connection of devices 62 and 70 (node 78) is coupled to the drain electrode of device 66 and to the gate electrode of pull-down transistor 80. The drain electrode of device 76 is coupled to $V_{DD}$, and the source electrode of device 80 is coupled to ground. The source/drain junction of devices 76 and 80 are coupled to output pad or terminal 82.

Referring now also to FIGS. 2A–2P, the operation of a circuit shown in FIG. 1 will be described. Let us assume that an input signal falls from a logic 1 level to a logic 0 level as is shown at time t1 in FIG. 2C. On the next rising edge of clock $\phi F$ (FIG. 2A), device 10 is turned on causing the voltage at node 14 (FIG. 2E) to fall at time t2. With a low voltage at the input of inverter 16, node 18 will rise in voltage as is shown in FIG. 2F turning on natural device 22. Natural device 20 whose gate is coupled to the voltage of node 14 remains in a substantially off condition. Additionally, device 28 having a gate coupled to $\phi R$ is also off since $\phi R$ at this time is low. Therefore, with devices 20 and 28 off and natural device 22 on, the voltage at node 30 will rise as is shown in FIG. 2G. With a high voltage applied to a first input of NOR gate 32 from node 30, node 58 will go low as shown in FIG. 2H. With a low voltage at the gate of device 50 and since the voltage at node 44 is also low (FIG. 2L), the voltage at node 56 (FIG. 2I) source follows the voltage at node 58. Therefore, a low voltage is applied to the gate of natural device 60, and since the voltage at node 46 (FIG. 2M) is also low, both devices 60 and 64 remain in substantially an off condition.

Device 74 is a depletion device which is normally on, and since the gate of device 68 is coupled back to node 30 device 68 will also turn on causing the voltage at node 72 (FIG. 2J) to source follow the voltage at node 56 (FIG. 2I). Thus, a low voltage is applied to the gate of device 76. Depletion device 74 is an extremely low current device which is used to clamp any bootstrapping voltage to $V_{DD}$ which might occur at node 72 due to output 82 rising and the capacitive effect of the channel of device 76. The depletion device is easily pulled to ground by either of devices 64 and 68 even though it is always on.

The gate of natural device 70 is coupled to the high voltage appearing at node 30, and the gate of device 62 is coupled to the low voltage appearing at node 56. Therefore, device 70 is turned on while device 62 remains in an off condition. Therefore, the voltage at node 78 (FIG. 2K) will rise. This is true since the voltage at node 48 (FIG. 2N) is low maintaining device 66 in an off condition. With a high voltage at node 78, device 80 is turned on causing the output 82 (FIG. 2P) to go low.

The buffer circuit remains in a stable condition until the input signal rises to a logic 1 at time t3 shown in FIG. 2C. On the next rising edge of clock $\phi F$ applied to the gate of device 10, the voltage at node 14 rises (time t4 shown in FIG. 2E). This voltage is applied to the input of inverter 16 causing a low voltage to appear at node 18 (FIG. 2F). This low voltage is applied to the gate of natural device 22 while the high voltage at node 14 is applied to the gate of natural device 20 turning it on. On the next rising edge of clock $\phi R$ which is coupled to the gate of device 28, device 28 will turn on causing a low voltage to appear at node 30 at time t5 shown in FIG. 2G. This low voltage is applied to a first input of NOR gate 32 while a second low voltage appearing at node 44 is applied to a second input of NOR gate 32. This results in a high voltage appearing at node 58 (FIG. 2H). As previously described, the voltage at node 56 (FIG. 2I) source follows the voltage at node 58, and the voltage at node 72 (FIG. 2J) source follows the voltage at node 56. Thus, a high is applied to the gate of device 76 turning it on.

The low voltage appearing at node 30 is applied to the gate of natural device 70 maintaining the device in substantially an off condition while the high voltage appearing at node 56 is applied to the gate of device 62 turning it on. This results in a low voltage appearing at node 78 (FIG. 2K) which is supplied to the gate of device 80 maintaining it in an off condition. Thus, with device 76 on and device 80 off, a high voltage appears at output 82 as is shown in FIG. 2P. It should be appreciated that when the input signal again rose to a high logic level at time t3, node 30 acts as a dynamic holding node and leakage to ground is minimized by making device 28 an enhancement device. It is not until the next occurring rising edge of clock ØR that nodes 30, 58, 56, 72 and 78 will reverse in voltage. This causes the output at 82 to return to a high voltage level in synchronism with the rising edge of clock ØR. It should further be appreciated that the inclusion of two natural devices 20 and 22 in edge definition portion 2 increases speed capabilities in the output rise and output fall times. Further, the use of natural devices instead of depletion devices reduces power consumption since depletion devices are normally "on".

Output 82 can be rendered floating by presenting a three-state control signal (TSC) to terminal 42. This signal is shown as going high at time t6 in FIG. 2D. At the next occurrence of clock ØT at terminal 40, devices 34, 36 and 38 turn on applying high logic level voltages to nodes 44, 46 and 48 shown in FIGS. 2L, 2M and 2N respectively. The high voltages at nodes 46 and 48 are applied to the gates of devices 64 and 66 respectively. Furthermore, the high voltage appearing at node 44 is applied to an input of NOR gate 32 and to the gate of device 52. Thus, a low voltage is produced at node 58 (FIG. 2H) at time t7. This low voltage is applied to the gate of natural device 50 maintaining it in an off condition. Thus, a low voltage will appear at node 56 (FIG. 2I) maintaining device 60 in an off condition. With devices 64 and 66 having their gates coupled to the high voltages at nodes 46 and 48 respectively, devices 64 and 66 turn on producing low voltages at nodes 72 and 78 (FIGS. 2J and 2K respectively). Thus, low voltages are applied to the gates of devices 76 and 80 maintaining them off and leaving the output 82 floating. This condition is shown as beginning at time t7 in FIG. 2P. It should be appreciated that nodes 44, 46 and 48 are dynamic nodes which are refreshed during every occurrence of clock signal ØT.

When the tri-state control signal again goes low (time t8 in FIG. 2D), the next occurring rising edge of clock ØT will free the circuit to again track the input signal as described above.

As stated previously, clock ØT has been chosen to be the equivalent of clock ØF; however, this is not a necessary requirement. Furthermore, it should be appreciated that devices 34, 36 and 38 may be combined into a single device although three devices yield a better configuration in practice. Finally, the circuit has been designed on the assumption that the external circuitry which generates the three-state control signal has knowledge of the input signals such that the three-state control signal will only go high when the input signal is high.

The above described buffer circuit can be rendered conditional by disconnecting the drain of device 22 in edge definition portion 2 and connecting it to a data input. In this manner, the buffer will discharge only when the data commands it to.

The above description is given by way of example only. Changes in form and details may be made by one skilled in the art without departing from the scope of the invention as defined by the appended claims.

I claim:

1. An edge definition circuit for synchronizing an input signal with first and second clock signals, comprising:
   first means coupled to said input signal and to said first clock signal for producing a first voltage transition on an output node in response to a voltage transition of said input signal, said first voltage transition occuring at a time determined by said first clock signal; and
   second means coupled to said first means and said second clock signal for producing a second voltage transition on said output node in response to another transition of said input signal, said second voltage transition occurring at a time determined by said second clock signal.

2. A circuit according to claim 1 wherein said first means comprises:
   a first field effect transistor having a first electrode coupled to said input signal, a gate electrode coupled to said first clock signal and a second electrode;
   inverter means having an input coupled to said second electrode and having an output; and
   a first natural field effect transistor having a gate electrode coupled to the output of said inverter means, a drain electrode coupled to an enabling potential and having a source electrode at which said first and second voltage transitions occur, said first natural field effect transistor having a threshold voltage of substantially zero volts.

3. A circuit according to claim 2 wherein said second means comprises:
   a second field effect transistor having a gate electrode coupled to said second clock signal, a drain electrode coupled to the source of said first natural transistor and having a source electrode; and
   a second natural transistor having a gate electrode coupled to the input of said inverter means, a source electrode coupled to ground and having a drain electrode coupled to the source electrode of said second field effect transistor, said second natural field effect transistor having a threshold voltage of substantially zero volts.

4. A circuit according to claim 3 wherein said second field effect transistor is of the enhancement type.

5. A circuit according to claim 2 wherein said enabling potential is a source of supply voltage.

6. A circuit according to claim 2 wherein said enabling potential is a source of data input signals.

7. A circuit according to claim 1 wherein said first and second clock signals are 180 degrees out of phase.

8. A circuit for buffering an input signal in accordance with occurrences of first and second clock signals, comprising:
   first means coupled to said input signal and to said first clock signal for producing a first voltage transition in response to a voltage transition of said input signal, said first voltage transition occurring at a time determined by said first clock signal;
   second means coupled to said first means and said second clock signal for producing a second voltage transition in response to another transition of said input signal, said second voltage transition occurring at a time determined by said second clock signal;
   driver circuit means coupled to said first and second means and responsive to said first and second voltage transitions for generating output control signals; and
   output means coupled to said driver circuit means for receiving said output control signals and generating therefrom an output representative of said input signal.

9. A circuit according to claim 8 further including third means for receiving a three state control signal and a third clock signal, said third means for disabling said driver circuit means so as to prevent generation of said output control signals and render said output signal floating.

10. A circuit according to claim 9 wherein said first means comprises:
- a first field effect transistor having a first electrode coupled to said input signal, a gate electrode coupled to said first clock signal and a second electrode;
- inverter means having an input coupled to said second electrode and having an output; and
- a first natural field effect transistor having a gate electrode coupled to the output of said inverter means, a drain electrode coupled to an enabling potential and having a source electrode at which said first and second voltage transitions occur, said first natural field effect transistor having a threshold voltage of substantially zero volts.

11. A circuit according to claim 10 wherein said second means comprises:
- a second field effect transistor having a gate electrode coupled to said second clock signal, a drain electrode coupled to the source of said first natural transistor and having a source electrode; and
- a second natural transistor having a gate electrode coupled to the input of said inverter means, a source electrode coupled to ground and having a drain electrode coupled to the source electrode of said second field effect transistor, said second natural field effect transistor having a threshold voltage of substantially zero volts.

* * * * *